United States Patent
Chen

(10) Patent No.: US 10,153,188 B1
(45) Date of Patent: Dec. 11, 2018

(54) MICRO TRANSFER PRINTING METHOD

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/551,289

(22) PCT Filed: Jun. 20, 2017

(86) PCT No.: PCT/CN2017/089264
§ 371 (c)(1),
(2) Date: Aug. 16, 2017

(30) Foreign Application Priority Data

May 23, 2017 (CN) .......................... 2017 1 0370030

(51) Int. Cl.
*H01L 21/683* (2006.01)
*H01L 21/677* (2006.01)
(Continued)

(52) U.S. Cl.
CPC .......... *H01L 21/677* (2013.01); *B41J 2/1631* (2013.01); *H01L 33/005* (2013.01); *H01L 33/40* (2013.01); *H01L 33/62* (2013.01)

(58) Field of Classification Search
CPC ....... H01L 21/677; H01L 21/82; H01L 33/40; H01L 33/62; H01L 33/005; H01L 21/67144; H01L 27/156
See application file for complete search history.

(56) References Cited

U.S. PATENT DOCUMENTS 8,349,116 B1 * 1/2013 Bibl .................. H01L 21/67144
156/249
9,555,644 B2 * 1/2017 Rogers .................... B41F 16/00
(Continued)

FOREIGN PATENT DOCUMENTS

CN          102324393 A     1/2012
CN          105493297 A     4/2016
(Continued)

*Primary Examiner* — Kyoung Lee
*Assistant Examiner* — Christina Sylvia
(74) *Attorney, Agent, or Firm* — Leong C. Lei

(57) ABSTRACT

The present invention provides a micro transfer printing method, which uses pick-up projections provided on a transfer head to suck and hold micro components arranged on a carrier plate, followed by reversing the transfer head and the carrier plate to make the transfer head positioned under the carrier plate, and then separates the transfer head and the carrier plate from each other to allow the micro components that are sucked and held by the pick-up projections to be carried by and supported on the transfer head, and then moves the transfer head that carries thereon the micro components to a location above a receiving substrate and turning the transfer head up side down to allow the micro components that are held on the pick-up projections to be positioned on the receiving substrate. In the micro transfer printing method of the present invention, during the course that the transfer head transfers the micro components, the micro components are carried by and supported on the transfer head and compared to the prior art, holding the micro components on the transfer head does not require any means to overcome influence caused by the gravity so as to ensure stable and smooth transfer of the micro components by the transfer head to thereby allowing for fast movement of the transfer head and thus effectively increasing transfer rate and speed of the transfer head.

18 Claims, 6 Drawing Sheets

(51) Int. Cl.
*H01L 33/00* (2010.01)
*B41J 2/16* (2006.01)
*H01L 33/62* (2010.01)
*H01L 33/40* (2010.01)

(56) References Cited

U.S. PATENT DOCUMENTS

| | | | |
|---|---|---|---|
| 2014/0027709 A1* | 1/2014 | Higginson | H01L 23/3171 257/13 |
| 2015/0028362 A1* | 1/2015 | Chan | H01L 27/156 257/88 |
| 2015/0228525 A1 | 8/2015 | Golda et al. | |
| 2017/0062650 A1* | 3/2017 | Chen | H01L 33/005 |

FOREIGN PATENT DOCUMENTS

| | | | |
|---|---|---|---|
| CN | 105632985 A | 6/2016 | |
| CN | 106058010 A | 10/2016 | |
| CN | 106229287 A | 12/2016 | |

\* cited by examiner

MICRO TRANSFER PRINTING METHOD

BACKGROUND OF THE INVENTION

1. Field of the Invention

The present invention relates to the field of display technology, and more particular to a micro transfer printing method.

2. The Related Arts

A micro light-emitting diode (LED) is a device having a size between several microns and hundreds of microns. Since it is much smaller than regular LEDs in size, it becomes possible to use a single LED to serve as a pixel for displaying purposes. A micro LED display is a display device that displays an image with a display pixel array that is made up of a high-density arrangement of micro LED array, which, similar to a large scale outdoor LED display panel, allows each of the pixels to be addressable and individually drivable for light emission and can be considered as a miniature version of the outdoor LED display panel, wherein pixel distance is reduced from the order of millimeters to the order of microns. The micro LED display, similar to an organic light-emitting diode (OLED) display, is a self-luminous display, but compared to the OLED display, the micro LED display shows advantages, such as better material stability, extended life span, and being free of burn-in, and is considered the most powerful competitor of the OLED display.

In consideration of lattice match, the micro LED device must be first grown, through molecular beam epitaxy, on a sapphire type supply substrate, and followed by application of laser lift-off (LLO) technology to separate a micro LED bare chip from the supply substrate to be subsequently transferred, through micro transfer print, to a receiving substrate that is formed, in advance, with a circuit pattern, to form a micro LED array, which can be used to make a micro LED display panel. The basic principle of micro transfer printing of micro LEDs is generally as follows. A transfer head that comprises a pattern, such as a polydimethylsiloxane (PDMS) transfer head having a projection structure, is used to pick up, through suction, the micro LED bare chip from the supply substrate by means of a PDMS transfer layer that is adhesive, and then, the PDMS transfer head and the receiving substrate are aligned with each other, followed by having the micro LED bare chip that is picked and held by the PDMS transfer head attached to a predetermined location on the receiving substrate and then having the PDMS transfer head separated from the receiving substrate to complete the transfer of the micro LED bare chip and form a micro LED array.

Contemporary study results concerning micro LED display have been published by X-Celeprint Ltd., Ireland, and Texas University, USA. The industry does not pay attention to the advantage of the micro LED technology until the acquisition of LuxVue Technology Co., USA, by Apple Inc., USA, in the year of 2014. The technology owned by LuxVue Technology Co., is largely different from the micro transfer printing technology of X-Celeprint Ltd. in that X-Celeprint Ltd. uses the suction-attracting force provided by a film structure, such as PDMS, to carry out a transfer operation, while LuxVue Technology Co. applies electricity to projections of a transfer head and uses an electrostatic force to suction-attract a micro LED device.

No matter what way of suction-attraction carried out on a transfer head, the technical key issues are the transfer rate and speed of the transfer head. During the movement of a transfer head in a known micro transfer printing process, the transfer head, when suction-attracting parts having sizes of micrometer order, such as LED and integrated circuits (ICs), from a backing that supplies the parts, is actually operated to overcome the gravity and an attaching force of the backing. During movement and transfer processes, gravity also plays a role that affects the operations. Under the assumption that the transfer head has a fast moving speed, a consequence could occur that the devices, such as micro LEDs, fall from the transfer head during the movement. On the other hand, any effort attempting to enhance stability of the transfer process may affect the productivity due to compromise of moving speed of the transfer head.

SUMMARY OF THE INVENTION

An objective of the present invention is to provide a micro transfer printing method that effectively increases transfer rate and speed of a transfer head.

To achieve the above objective, the present invention provides a micro transfer printing method, which comprises the following steps:

Step S1: providing a transfer head and a carrier plate, wherein the transfer head comprises a plurality of pick-up projections and each of the pick-up projections comprises a suction surface; and the carrier plate receives a plurality of micro components provided thereon, wherein the transfer head is positionable on the carrier plate such that the suction surfaces of the pick-up projections face downwards to have the suction surfaces of the pick-up projections in contact engagement with the micro components provided on the carrier plate so as to allow the pick-up projections of the transfer head to pick and hold the micro components of the carrier plate thereon;

Step S2: reversing the transfer head and the carrier plate so that the transfer head is located under the carrier plate and the suction surfaces of the pick-up projections face upward, and then, separating the transfer head and the carrier plate from each other such that the transfer head carries thereon the micro components that are picked and held by the pick-up projections in Step S1; and Step S3: providing a receiving substrate, moving the transfer head that carries the micro components thereon to a location above the receiving substrate, turning the transfer head up side down such that the transfer head is located above the receiving substrate and the suction surfaces of the pick-up projections face downward, and positioning the micro components picked and held by the pick-up projections on the receiving substrate.

In the transfer head provided in Step S1, the suction surface of each of the pick-up projections is provided thereon with a stop wall.

The stop wall of each of the pick-up projections is provided on at least one side edge of the suction surface.

In Step S2, the micro component picked and held by each of the pick-up projections has a height that is greater than a height of the stop wall of the pick-up projection.

The stop wall of the transfer head is formed with a photolithographic operation.

The micro components are micro LEDs.

The micro components each comprise a metal electrode and the receiving structure provided in Step S3 comprises a TFT array substrate.

Step S3 further comprises making conduction between the metal electrodes of the micro components and the receiving substrate and allowing the micro components to be fixed to the receiving substrate.

The micro components are micro integrated circuit chips.

The transfer head comprises a polydimethylsiloxane (PDMS) transfer head and the pick-up projections are made of a PDMS material so that in Step S1, the micro components are picked up by means of an adhesive property of the pick-up projections.

The present invention also provides a micro transfer printing method, which comprises the following steps:

Step S1: providing a transfer head and a carrier plate, wherein the transfer head comprises a plurality of pick-up projections and each of the pick-up projections comprises a suction surface; and the carrier plate receives a plurality of micro components provided thereon, wherein the transfer head is positionable on the carrier plate such that the suction surfaces of the pick-up projections face downwards to have the suction surfaces of the pick-up projections in contact engagement with the micro components provided on the carrier plate so as to allow the pick-up projections of the transfer head to pick and hold the micro components of the carrier plate thereon;

Step S2: reversing the transfer head and the carrier plate so that the transfer head is located under the carrier plate and the suction surfaces of the pick-up projections face upward, and then, separating the transfer head and the carrier plate from each other such that the transfer head carries thereon the micro components that are picked and held by the pick-up projections in Step S1; and Step S3: providing a receiving substrate, moving the transfer head that carries the micro components thereon to a location above the receiving substrate, turning the transfer head up side down such that the transfer head is located above the receiving substrate and the suction surfaces of the pick-up projections face downward, and positioning the micro components picked and held by the pick-up projections on the receiving substrate;

wherein in the transfer head provided in Step S1, the suction surface of each of the pick-up projections is provided thereon with a stop wall; and wherein the transfer head comprises a polydimethylsiloxane (PDMS) transfer head and the pick-up projections are made of a PDMS material so that in Step S1, the micro components are picked up by means of an adhesive property of the pick-up projections.

The efficacy of the present invention is that the present invention provides a micro transfer printing method, which uses pick-up projections provided on a transfer head to suck and hold micro components arranged on a carrier plate, followed by reversing the transfer head and the carrier plate to make the transfer head positioned under the carrier plate, and then separates the transfer head and the carrier plate from each other to allow the micro components that are sucked and held by the pick-up projections to be carried by and supported on the transfer head, and then moves the transfer head that carries thereon the micro components to a location above a receiving substrate and turning the transfer head up side down to allow the micro components that are held on the pick-up projections to be positioned on the receiving substrate. In the micro transfer printing method of the present invention, during the course that the transfer head transfers the micro components, the micro components are carried by and supported on the transfer head and compared to the prior art, holding the micro components on the transfer head does not require any means to overcome influence caused by the gravity so as to ensure stable and smooth transfer of the micro components by the transfer head to thereby allowing for fast movement of the transfer head and thus effectively increasing transfer rate and speed of the transfer head.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
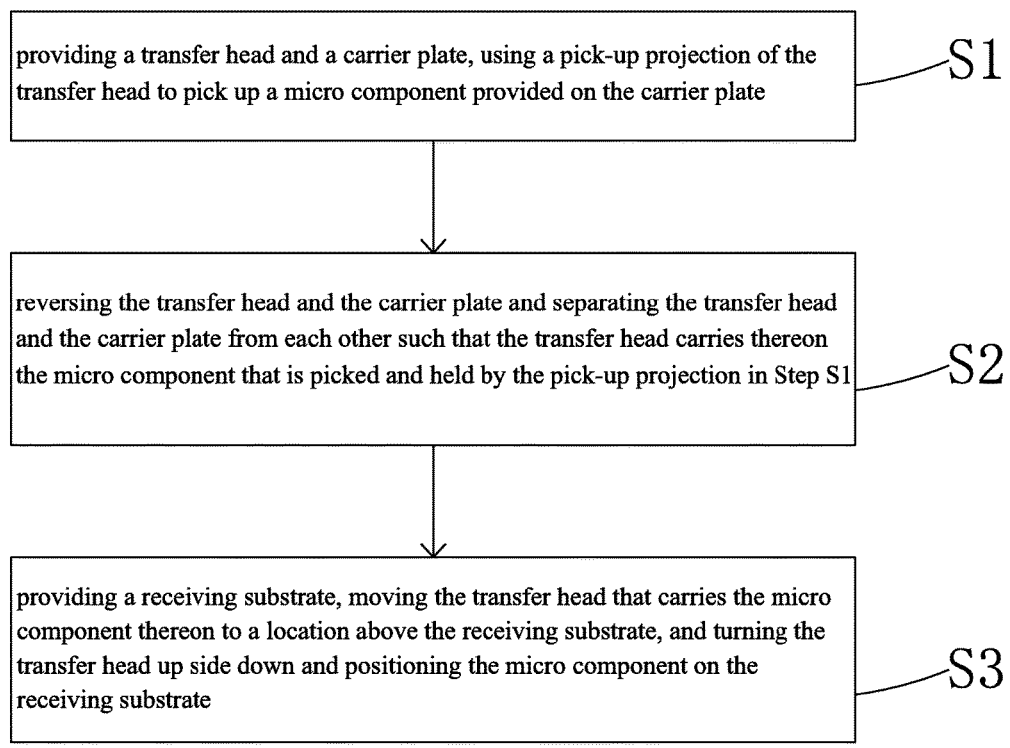
FIG. 1 is a flow chart illustrating a micro transfer printing method according to the present invention.
Figure 2:
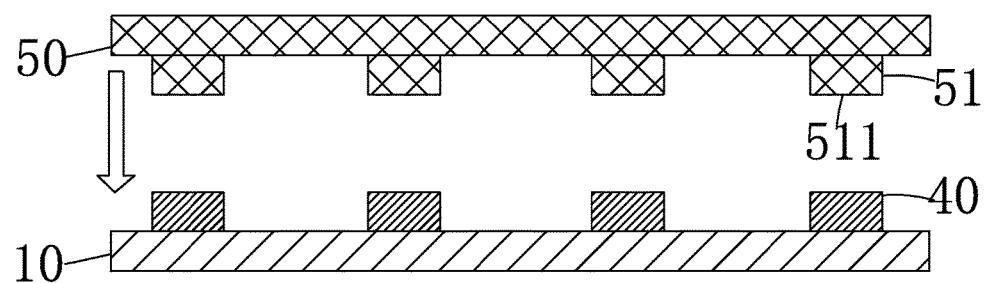
FIGS. 2-3 are schematic views illustrating Step S1 of the micro transfer printing method according to the present invention.
Figure 3:
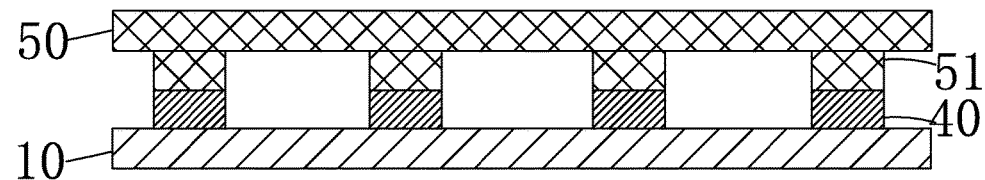

Referring to FIG. 1, the present invention provides a micro transfer printing method, which comprises the following steps:

Step S1: as shown in FIGS. 2-3, providing a transfer head 50 and a carrier plate 10, wherein the transfer head 50 comprises a plurality of pick-up projections 51 and each of the pick-up projections 51 comprises a suction surface 511; and the carrier plate 10 receives a plurality of micro components 40 provided thereon, wherein the transfer head 50 is positionable on the carrier plate 10 such that the suction surfaces 511 of the pick-up projections 51 face downwards to have the suction surfaces 511 of the pick-up projections 51 in contact engagement with the micro components 40 provided on the carrier plate 10 so as to allow the pick-up projections 51 of the transfer head 50 to pick and hold the micro components 40 of the carrier plate 10 thereon.

Figure 4:
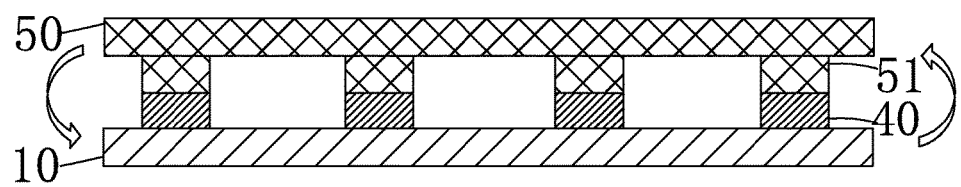
FIGS. 4-6 are schematic views illustrating Step S2 of the micro transfer printing method according to the present invention.
Figure 5:
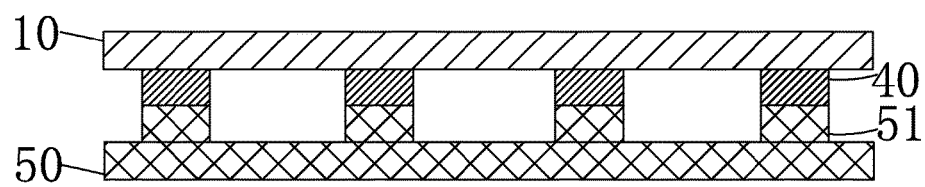
Figure 6:
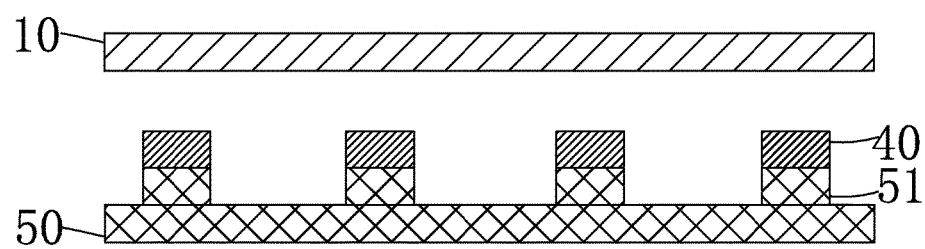

Step S2: as shown in FIGS. 4-6, reversing the transfer head 50 and the carrier plate 10 so that the transfer head 50 is located under the carrier plate 10 and the suction surfaces 511 of the pick-up projections 51 face upward, and then, separating the transfer head 50 and the carrier plate 10 from each other such that the transfer head 50 carries thereon the micro components 40 that are picked and held by the pick-up projections 51 in Step S1.

Figure 7:
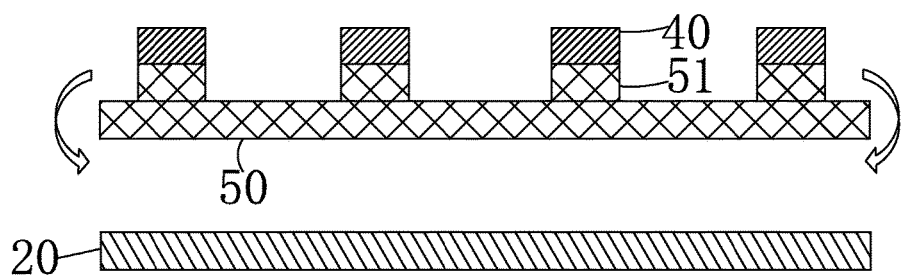
FIGS. 7-9 are schematic views illustrating Step S3 of the micro transfer printing method according to the present invention.
Figure 8:
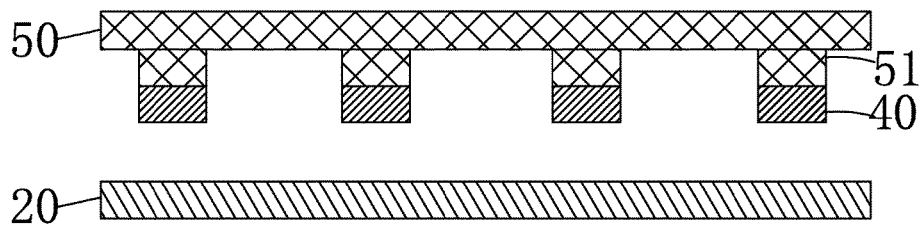
Figure 9:
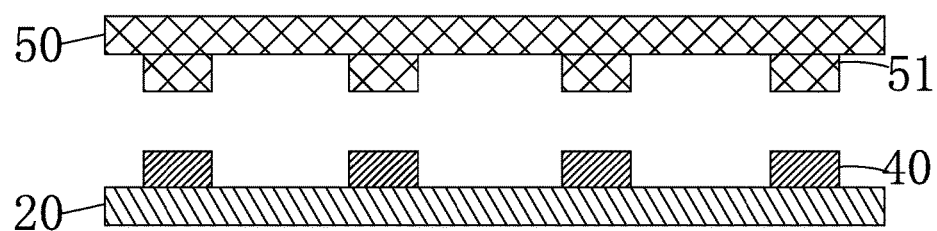

Step S3: as shown in FIGS. 7-9, providing a receiving substrate 20, moving the transfer head 50 that carries the micro components 40 thereon to a location above the receiving substrate 20, turning the transfer head 50 up side down such that the transfer head 50 is located above the receiving substrate 20 and the suction surfaces 511 of the pick-up projections 51 face downward, and positioning the micro components 40 picked and held by the pick-up projections 51 on the receiving substrate 20.

In the micro transfer printing method according to the present invention, during the course that the transfer head 50 transfers the micro components 40, the micro components 40 are carried and supported on the transfer head 50. Compared to the prior art, holding the micro components 40 on the transfer head 50 does not require any means to overcome influence caused by the gravity, so as to ensure stable and smooth transfer of the micro components 40 by the transfer head 50 in Step S3 to thereby allowing for fast movement of the transfer head 50 and thus effectively increasing the transfer rate and speed of the transfer head 50.

Figure 10:
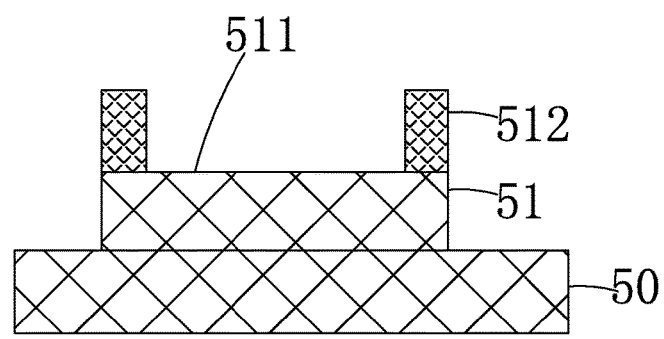
FIG. 10 is a schematic view, in an enlarged scale, showing a pick-up projection of a transfer head used in the micro transfer printing method according to the present invention.

Specifically, the suction surface 511 of each of the pick-up projections 51 has a size that is larger than a size of the micro component 40 sucked and held thereby. As shown in FIG. 10, in the transfer head 50 provided in Step S1, the suction surfaces 511 of each of the pick-up projections 51 have edges on which stop walls 512 are provided such that during the process that the micro components 40 are transferred by the transfer head 50, even the micro components 40 occasionally undergoes vibration and oscillation, due to an effect of retention achieved with the stop walls 512, the micro components 40 are prevented from falling out of the pick-up projections 51.

Figure 12:
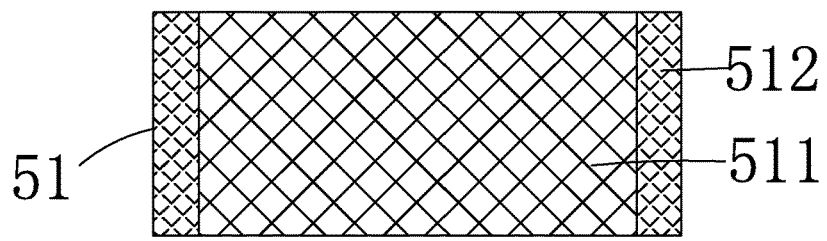
FIG. 12 is a schematic view showing a pick-up projection provided with stop walls arranged on two opposite side edges of a suction surface thereof in the micro transfer printing method according to the present invention.
Figure 13:
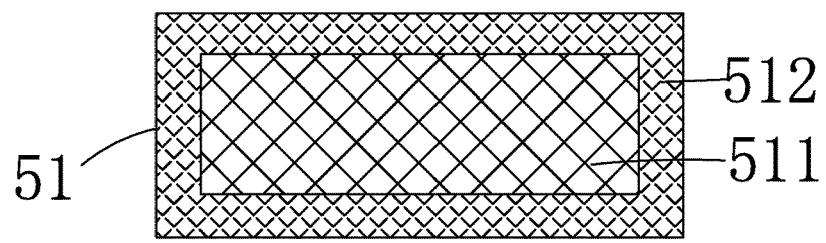
FIG. 13 is a schematic view showing a pick-up projection provided with stop walls arranged on four side edges of a suction surface thereof in the micro transfer printing method according to the present invention.

Further, the stop walls 512 of each of the pick-up projections 51 can be provided on one, two, three, or four side edges of the four edges of the suction surface 511. For example, as shown in FIG. 12, each of the pick-up projections 51 has stop walls 512 respectively provided on two opposite side edges of the suction surface 511; or alternatively, as shown in FIG. 13, each of the pick-up projections 51 has stop walls 512 respectively provided on four side edges of the suction surface 511 to form a structure that surrounds the micro component 40.

Specifically, the stop walls 512 of the transfer head 50 are formed in a forming process of the transfer head 50 with a photolithographic operation.

Figure 11:
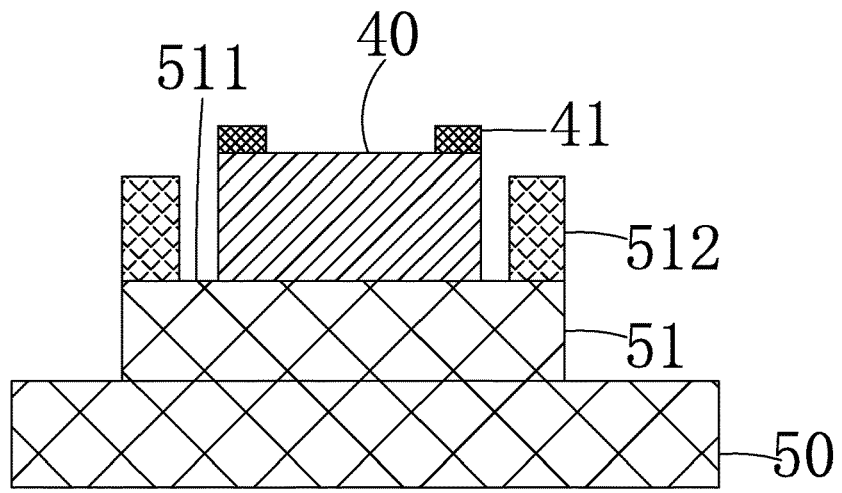
FIG. 11 is a schematic view showing a micro component transferred by the transfer head in Step S3 of the micro transfer printing method according to the present invention in a condition of being in alignment with a pick-up projection.

Specifically, as shown in FIG. 11, in Step S2, the micro component 40 sucked and held on each of the pick-up projections 51 has a height that is greater than a height of the stop walls 512 of the pick-up projection 51 so that, in Step S3, when the transfer head 50 is turned up side down, the stop walls 512 do not interfere with the micro component 40 being positioned on the receiving substrate 20 thereby preventing affecting bonding between the micro component 40 and the receiving substrate 20.

Specifically, the micro components 40 can be micro light emitting diodes (LEDs), which comprises metal electrodes 41, and the receiving substrate 20 provided in Step S3 is a thin-film transistor (TFT) array substrate. In addition, Step S3 may further comprises making conduction between the metal electrodes 41 of the micro components 40 and the receiving substrate 20 and allowing the micro components 40 to be fixed to the receiving substrate 20, meaning carrying out bonding of the micro components 40, namely the micro LEDs, to the receiving substrate 20.

Further, the micro components 40 can alternatively be other devices having a size of a micrometer scale or even a smaller size, such as micro integrated circuit chip.

Specifically, the transfer head 50 is a PDMS transfer head, and the pick-up projections 51 are made of a PDMS material so that in Step S1, the micro components 40 are picked up by means of the adhesive property of the pick-up projections 51. In addition, the transfer head 50 can alternatively be other types of transfer head, such as a transfer head that carries out picking by means of an electrostatic force.

In summary, the present invention provides a micro transfer printing method, which uses pick-up projections provided on a transfer head to suck and hold micro components arranged on a carrier plate, followed by reversing the transfer head and the carrier plate to make the transfer head positioned under the carrier plate, and then separates the transfer head and the carrier plate from each other to allow the micro components that are sucked and held by the pick-up projections to be carried by and supported on the transfer head, and then moves the transfer head that carries thereon the micro components to a location above a receiving substrate and turning the transfer head up side down to allow the micro components that are held on the pick-up projections to be positioned on the receiving substrate. In the micro transfer printing method of the present invention, during the course that the transfer head transfers the micro components, the micro components are carried by and supported on the transfer head and compared to the prior art, holding the micro components on the transfer head does not require any means to overcome influence caused by the gravity so as to ensure stable and smooth transfer of the micro components by the transfer head to thereby allowing for fast movement of the transfer head and thus effectively increasing transfer rate and speed of the transfer head.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A micro transfer printing method, comprising the following steps:

Step S1: providing a transfer head and a carrier plate, wherein the transfer head comprises a plurality of pick-up projections and each of the pick-up projections comprises a suction surface; and the carrier plate receives a plurality of micro components provided thereon, wherein the transfer head is positionable on the carrier plate such that the suction surfaces of the pick-up projections face downwards to have the suction surfaces of the pick-up projections in contact engagement with the micro components provided on the carrier plate so as to allow the pick-up projections of the transfer head to pick and hold the micro components of the carrier plate thereon;

Step S2: reversing the transfer head and the carrier plate so that the transfer head is located under the carrier plate and the suction surfaces of the pick-up projections face upward, and then, separating the transfer head and the carrier plate from each other such that the transfer head carries thereon the micro components that are picked and held by the pick-up projections in Step S1; and Step S3: providing a receiving substrate, moving the transfer head that carries the micro components thereon to a location above the receiving substrate, turning the transfer head up side down such that the transfer head is located above the receiving substrate and the suction surfaces of the pick-up projections face downward, and positioning the micro components picked and held by the pick-up projections on the receiving substrate.

2. The micro transfer printing method as claimed in claim 1, wherein in the transfer head provided in Step S1, the suction surface of each of the pick-up projections is provided thereon with a stop wall.

3. The micro transfer printing method as claimed in claim 2, wherein the stop wall of each of the pick-up projections is provided on at least one side edge of the suction surface.

4. The micro transfer printing method as claimed in claim 2, wherein in Step S2, the micro component picked and held by each of the pick-up projections has a height that is greater than a height of the stop wall of the pick-up projection.

5. The micro transfer printing method as claimed in claim 2, wherein the stop wall of the transfer head is formed with a photolithographic operation.

6. The micro transfer printing method as claimed in claim 1, wherein the micro components are micro light emitting diodes (LEDs).

7. The micro transfer printing method as claimed in claim 6, wherein the micro components each comprise a metal electrode and the receiving structure provided in Step S3 comprises a thin-film transistor (TFT) array substrate.

8. The micro transfer printing method as claimed in claim 7, wherein Step S3 further comprises making conduction between the metal electrodes of the micro components and the receiving substrate and allowing the micro components to be fixed to the receiving substrate.

9. The micro transfer printing method as claimed in claim 1, wherein the micro components are micro integrated circuit chips.

10. The micro transfer printing method as claimed in claim 1, wherein the transfer head comprises a polydimethylsiloxane (PDMS) transfer head and the pick-up projections are made of a PDMS material so that in Step S1, the micro components are picked up by means of an adhesive property of the pick-up projections.

11. A micro transfer printing method, comprising the following steps:

Step S1: providing a transfer head and a carrier plate, wherein the transfer head comprises a plurality of pick-up projections and each of the pick-up projections comprises a suction surface; and the carrier plate receives a plurality of micro components provided thereon, wherein the transfer head is positionable on the carrier plate such that the suction surfaces of the pick-up projections face downwards to have the suction surfaces of the pick-up projections in contact engagement with the micro components provided on the carrier plate so as to allow the pick-up projections of the transfer head to pick and hold the micro components of the carrier plate thereon;

Step S2: reversing the transfer head and the carrier plate so that the transfer head is located under the carrier plate and the suction surfaces of the pick-up projections face upward, and then, separating the transfer head and the carrier plate from each other such that the transfer head carries thereon the micro components that are picked and held by the pick-up projections in Step S1; and Step S3: providing a receiving substrate, moving the transfer head that carries the micro components thereon to a location above the receiving substrate, turning the transfer head up side down such that the transfer head is located above the receiving substrate and the suction surfaces of the pick-up projections face downward, and positioning the micro components picked and held by the pick-up projections on the receiving substrate;

wherein in the transfer head provided in Step S1, the suction surface of each of the pick-up projections is provided thereon with a stop wall; and wherein the transfer head comprises a polydimethylsiloxane (PDMS) transfer head and the pick-up projections are made of a PDMS material so that in Step S1, the micro components are picked up by means of an adhesive property of the pick-up projections.

12. The micro transfer printing method as claimed in claim 11, wherein the stop wall of each of the pick-up projections is provided on at least one side edge of the suction surface.

13. The micro transfer printing method as claimed in claim 11, wherein in Step S2, the micro component picked and held by each of the pick-up projections has a height that is greater than a height of the stop wall of the pick-up projection.

14. The micro transfer printing method as claimed in claim 11, wherein the stop wall of the transfer head is formed with a photolithographic operation.

15. The micro transfer printing method as claimed in claim 11, wherein the micro components are micro light emitting diodes (LEDs).

16. The micro transfer printing method as claimed in claim 15, wherein the micro components each comprise a metal electrode and the receiving structure provided in Step S3 comprises a thin-film transistor (TFT) array substrate.

17. The micro transfer printing method as claimed in claim 16, wherein Step S3 further comprises making conduction between the metal electrodes of the micro components and the receiving substrate and allowing the micro components to be fixed to the receiving substrate.

18. The micro transfer printing method as claimed in claim 11, wherein the micro components are micro integrated circuit chips.

* * * * *